(12) United States Patent
Lung et al.

(10) Patent No.: US 6,432,782 B1
(45) Date of Patent: Aug. 13, 2002

(54) 8 BIT PER CELL NON-VOLATILE SEMICONDUCTOR MEMORY STRUCTURE UTILIZING TRENCH TECHNOLOGY AND DIELECTRIC FLOATING GATE

(75) Inventors: Hsing Lan Lung, Hsinchu; Tao Cheng Lu, Kaohsiung; Mam Tsung Wang, Hsinchu, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/776,290

(22) Filed: Feb. 2, 2001

Related U.S. Application Data

(62) Division of application No. 09/384,482, filed on Aug. 27, 1999, now Pat. No. 6,204,529.

(51) Int. Cl.[7] ...................... H01L 21/336; H01L 21/425
(52) U.S. Cl. ........................................ 438/300; 438/526
(58) Field of Search .................. 257/314–326; 438/257–267, 300, 526

(56) References Cited

U.S. PATENT DOCUMENTS

| | | | |
|---|---|---|---|
| 4,879,584 A | * 11/1989 | Takagi et al. ............... 257/334 |
| 5,408,115 A | 4/1995 | Chang | |
| 5,449,941 A | 9/1995 | Tamazaki et al. | |
| 5,467,308 A | 11/1995 | Chang et al. | |
| 5,508,544 A | 4/1996 | Shah | |
| 5,563,083 A | 10/1996 | Pein | |
| 5,619,052 A | 4/1997 | Chang et al. | |
| 5,768,192 A | 6/1998 | Eitan | |
| 5,789,776 A | * 8/1998 | Lancaster et al. ............ 257/296 |
| 5,864,159 A | * 1/1999 | Takahashi .................... 257/330 |
| 5,883,406 A | * 3/1999 | Nishizawa .................. 257/264 |
| 5,943,575 A | * 8/1999 | Chung ......................... 438/300 |
| 5,959,328 A | 9/1999 | Krautschneider et al. | |
| 5,969,384 A | 10/1999 | Hong et al. | |
| 6,118,159 A | 9/2000 | Willer et al. | |

* cited by examiner

*Primary Examiner*—Howard Weiss
*Assistant Examiner*—Marcos D. Pizarro-Crespo
(74) *Attorney, Agent, or Firm*—Sonnenschein Nath & Rosenthal

(57) ABSTRACT

The present application discloses a non-volatile semiconductor memory device for storing up to eight-bits of information. The device has a semiconductor substrate of one conductivity type, a central bottom diffusion region on top of a portion of the semiconductor substrate, a second semiconductor layer on top of the bottom diffusion region, and left and right diffusion regions formed in the second semiconductor layer apart from the central bottom diffusion region thus forming a first vertical channel between the right and central bottom diffusion regions. The device further includes a trapping dielectric layer formed over exposed portions of the semiconductor substrate, left, central and right bottom diffusion regions and second semiconductor layer and a wordline formed over the trapping dielectric layer. A methods of fabricating this novel cell using trench technology is also disclosed.

6 Claims, 9 Drawing Sheets

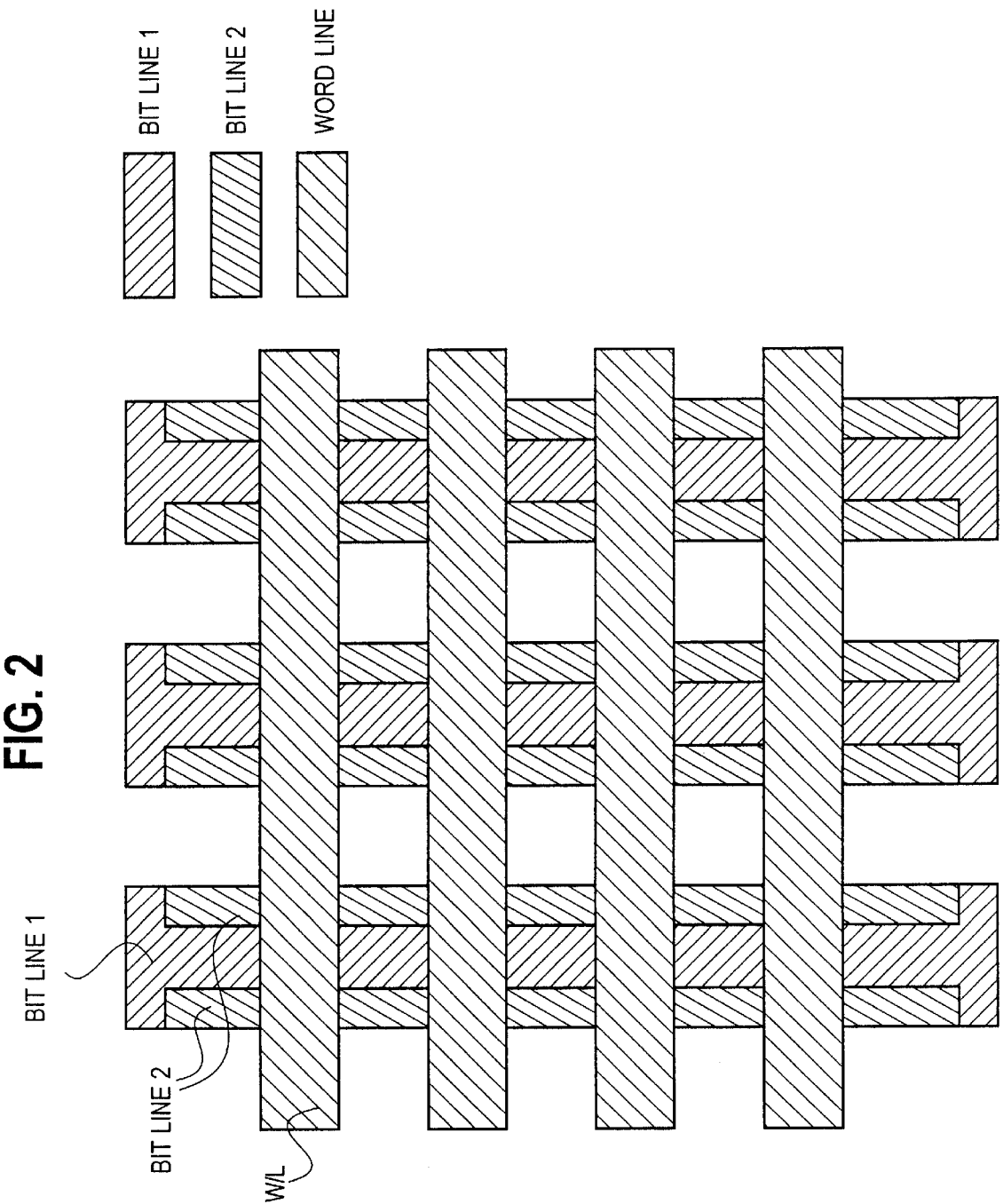

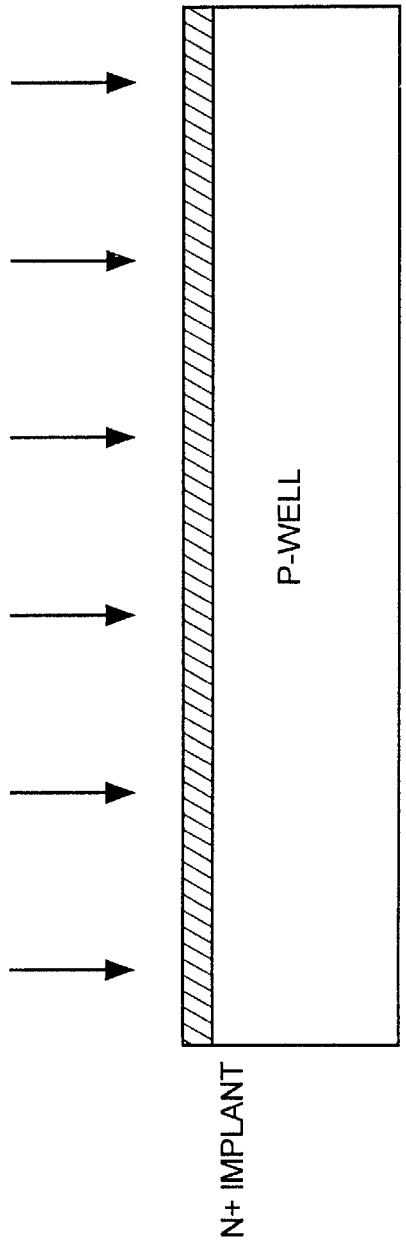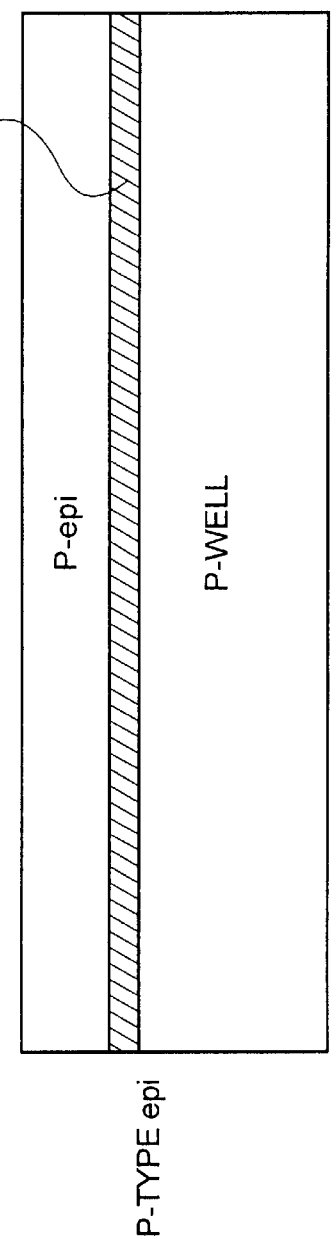

TOP DEVICE S/D IMPLANT

TRENCH

8 BIT PER CELL NON-VOLATILE SEMICONDUCTOR MEMORY STRUCTURE UTILIZING TRENCH TECHNOLOGY AND DIELECTRIC FLOATING GATE

This application is a divisional application of Ser. No. 09/384,482 filed Aug. 27, 1999, now U.S. Pat. No. 6,204,529, issued Mar. 20, 2001.

BACKGROUND OF THE INVENTION

1. Field of the Invention

The present invention relates in general to non-volatile digital memories and, more particularly, to an improved cell structure for a programmable non-volatile memory (such as conventional EEPROM or Flash EEPROM) that can store up to eight-bits of information and a method for fabricating same.

2. Background Art

Non-volatile memory devices, such as EPROM, EEPROM, and flash EPROM devices, generally include a matrix of transistors which act as memory cells for storing a single-bit of information. Each transistor in this matrix has source and drain regions formed on a n- or p-type semiconductor substrate, a thin tunnel dielectric layer formed on the surface of the semiconductor substrate positioned at least between the source and drain regions, a floating gate (formed of polysilicon) positioned on the insulating layer for holding a charge, a control gate and an interpoly dielectric positioned between the floating gate and control gate.

Traditionally, the interpoly dielectric had consisted of a single layer of silicon dioxide ($SiO_2$). However, more recently oxide/nitride/oxide composites (sometimes referred to as an ONO structure) have been used in place of the silicon dioxide because they exhibit decreased charge leakage over the single oxide layer (see Chang et al. U.S. Pat. No. 5,619,052).

U.S. Pat. No. 5,768,192 to Eitan discloses that ONO structures (as well as other charge trapping dielectrics) have been used as both insulator and floating gate. Eitan teaches that by programming and reading this transistor device in opposite directions (i.e., reversing "source" and "drain") shorter programming times still result in a high increase in exhibited threshold voltage. Eitan suggests that this result is useful in reducing programming time while still preventing "punch through" (i.e. condition where the lateral electric field is strong enough to draw electrons through to the drain, regardless of the applied threshold level).

The semiconductor memory industry has been researching various techniques and approaches to lower the bit cost of non-volatile memory. Two of the more important approaches are dimensional shrinking and multilevel storage. Multilevel storage (often referred to as multilevel cells) means that a single cell can represent more than one bit of data. In conventional memory cell design, only one bit has been represented by two different voltage levels, such as 0V and 5V (in association with some voltage margin), which represent 0 or 1. In multilevel storage more voltage ranges/current ranges are necessary to encode the multiple bits of data. The multiple ranges lead to reduced margins between ranges and require advanced design techniques. As a result, multilevel storage cells are difficult to design and manufacture. Some exhibit poor reliability. Some have slower read times than convention single-bit cells.

Accordingly, it is an object of the present invention to produce a non-volatile memory structure that achieves cost-savings by providing a structure capable of storing up to eight bits of data, thus significantly increasing the storage size of the non-volatile memory. It is an associated object of the present invention for this cell structure to operate without the use of reduced margins or advanced design techniques.

These and other objects will be apparent to those of ordinary skill in the art having the present drawings, specification and claims before them.

SUMMARY OF THE INVENTION

The present invention discloses a single cell non-volatile semiconductor memory device for storing up to eight-bits of information. The device has a semiconductor substrate of one conductivity type, a central bottom diffusion region on top of a portion of the semiconductor substrate, a second semiconductor layer on top of the bottom diffusion region, and left and right diffusion regions formed in the second semiconductor layer apart from the central bottom diffusion region thus forming a first vertical channel between the right and central bottom diffusion regions. The device further includes a trapping dielectric layer formed over exposed portions of the semiconductor substrate, left, central and right bottom diffusion regions and second semiconductor layer and a wordline formed over the trapping dielectric layer.

The foregoing structure can be fabricated by: (1) forming a semiconductor substrate of one conductivity type; (2) implanting ions in the semiconductor substrate a layer of conductivity type opposite to the conductivity type of the semiconductor substrate to form a bottom diffusion region; (3) growing a second semiconductor layer on at least a portion of said bottom diffusion region; (4) implanting ions in the second semiconductor layer to form in the second semiconductor layers, right and left diffusion regions of the same conductivity type; (5) trenching the resulting semiconductor wafer to form one or more free-standing cells on the semiconductor substrate; (6) depositing a trapping dielectric structure on the exposed faces of the free-standing cells and semiconductor substrate; and (7) depositing a polysilicon control gate on top of the trapping dielectric structure.

BRIEF DESCRIPTION OF THE DRAWINGS

FIG. 2 is a plan view of an array of 8-bit cells according to the present invention;

FIGS. 5A–5F are cross-sectional views-taken along the wordline-of the various steps performed in a method for fabricating a twin-bit non-volatile memory cell according to the present invention.

BEST MODES OF CARRYING OUT THE INVENTION

Figure 1A:
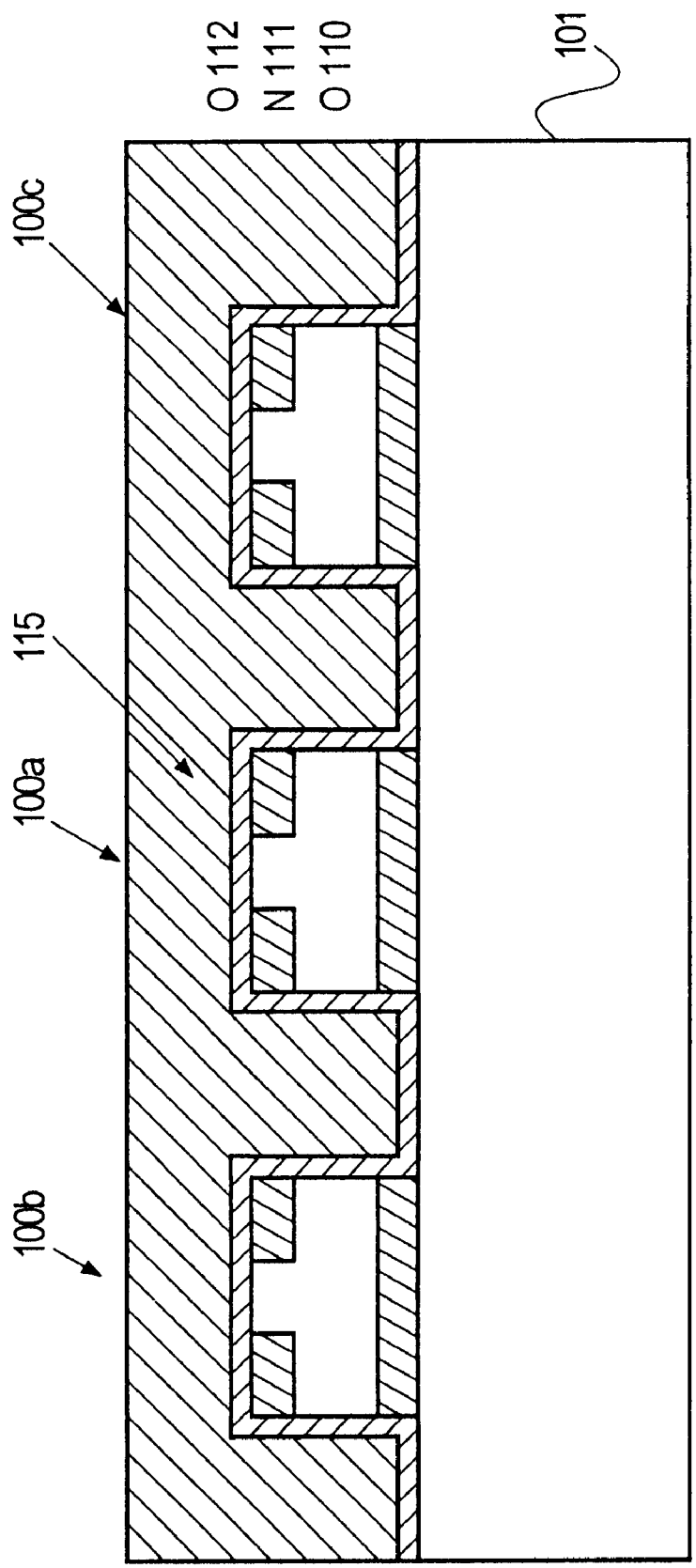
FIG. 1a is a cross-sectional view-taken along the wordline-of the eight-bit non-volatile memory cell showing the physical structure of the present invention.

While the present invention may be embodied in many different forms and produced by various different fabrication processes, there is shown in the drawings and discussed herein one specific embodiment and fabrication method with the understanding that the present disclosure is to be considered only as an exemplification of the principles of the invention and is not intended to limit the invention to the embodiment illustrated.

Figure 1B:
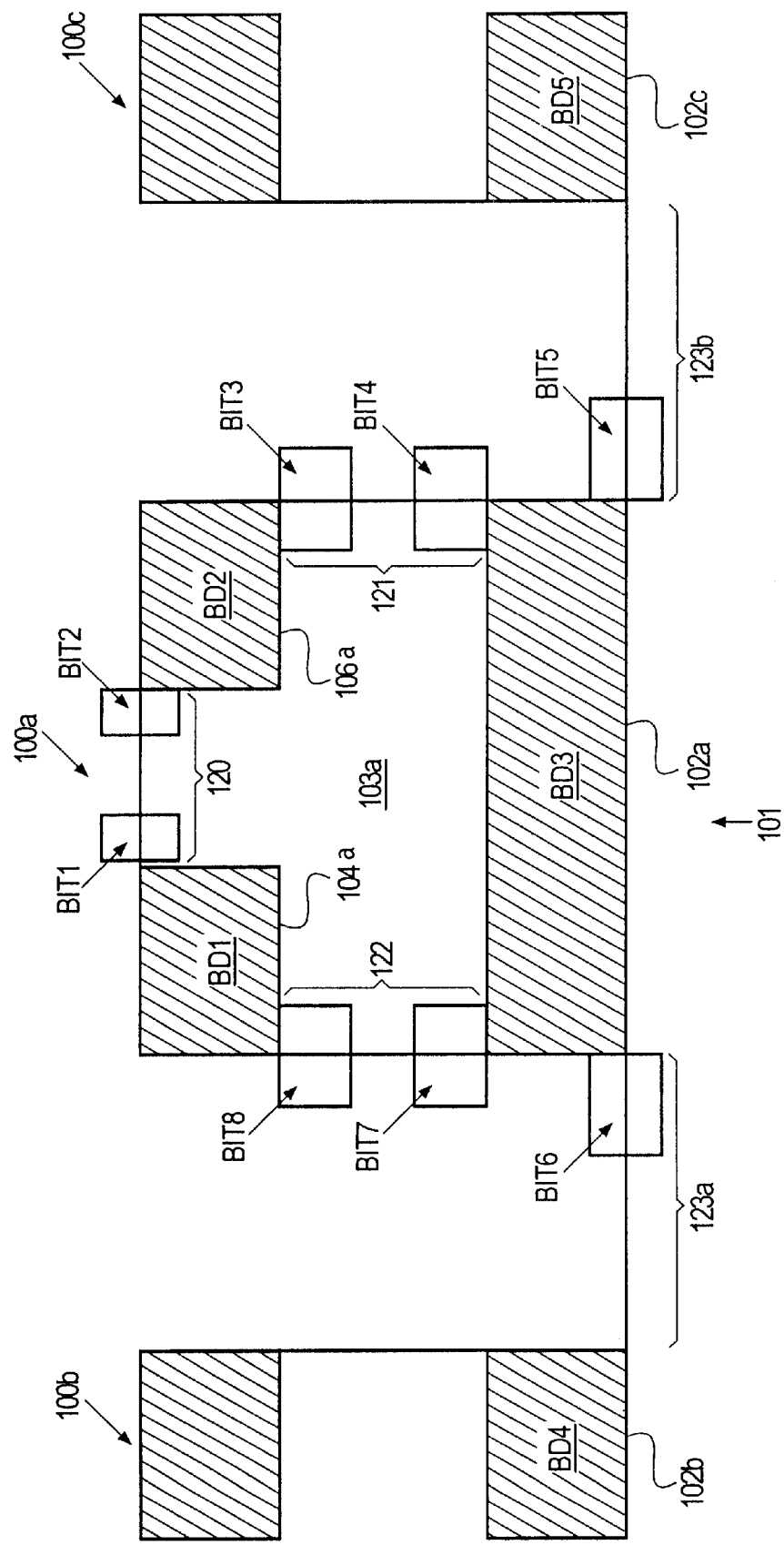
FIG. 1b is a plan view depicting the layout of the eight-bits stored in a cell of the present invention.
Figure 1C:
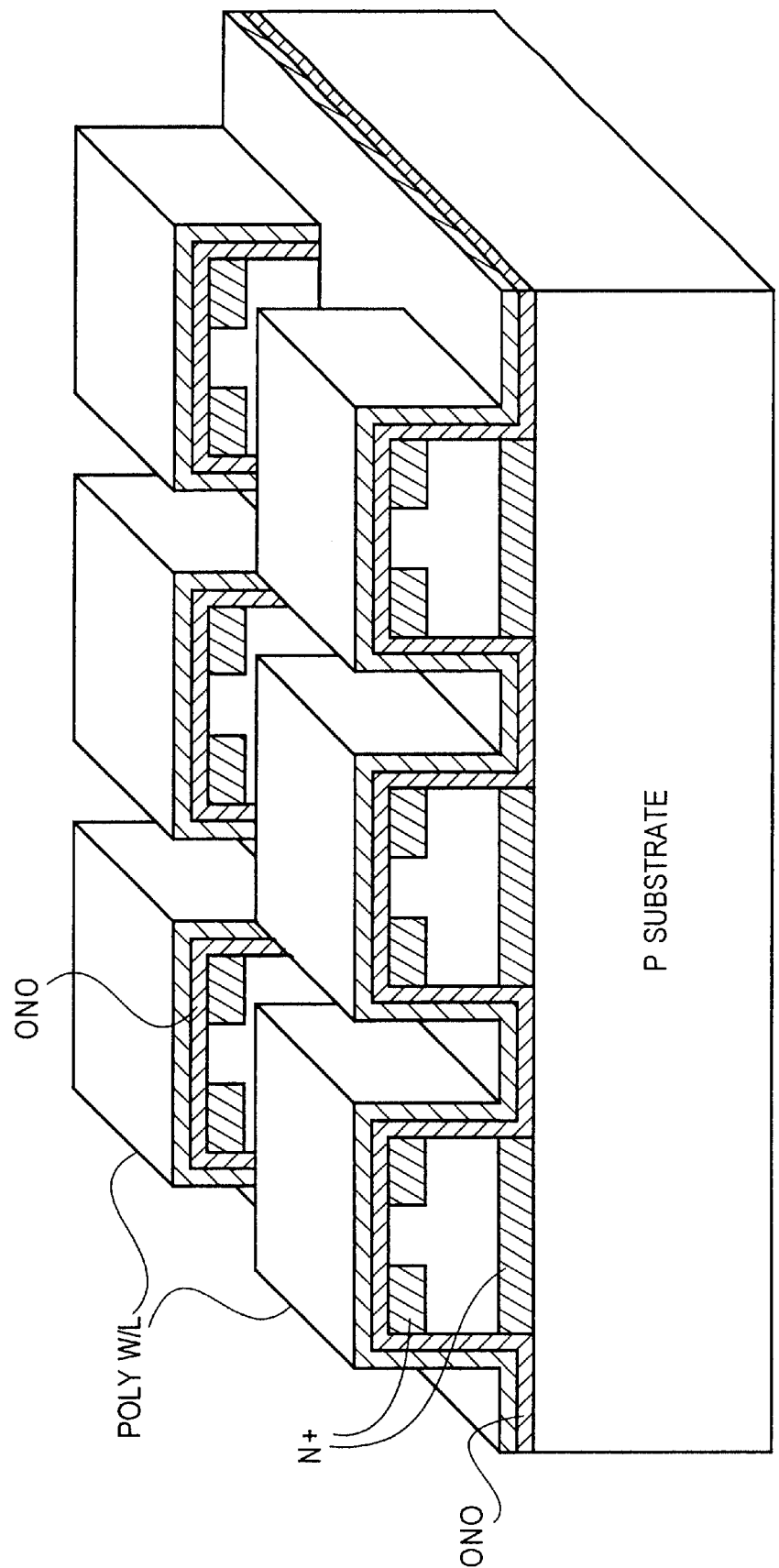
FIG. 1c is a front perspective view of a plurality of 8-bit memory cells on a semiconductor substrate.

FIGS. 1a and 1b show eight-bit non-volatile memory cell structures 100a, 100b, 100c (which may be collectively referred to by reference number 100) that are formed on and incorporate a portion of semiconductor substrate 101 in association with the present invention. As each cell 100 is preferably constructed identically, the structure for cell 100a shall be described with the understanding that such structure is preferably found in each cell, Some memory cells varying from this main construct may be used in association with cell 100. In fact, it is contemplated that modified versions of cell 100 (and other types of cells) will likely be used at the periphery of a memory array. FIG. 1c is a front perspective view of a plurality of 8-bit memory cells on a semiconductor substrate.

Cell 100a has a bottom diffusion region 102a on top of semiconductor substrate 101 having a conductivity type opposite to the conductivity type of substrate 101. diffusion region 102a, a second semiconductor layer 103a having the same conductivity type of substrate 101 is formed. Within this second semiconductor layer, left diffusion region 104a and right diffusion region 106a are fashioned apart from one another both having the same conductivity type as bottom diffusion region 102 ($n^+$ in the disclosed embodiment. As a result, first horizontal channel region 120 is formed between left and right diffusion regions 104a and 106a; first vertical channel region 121 is formed between right and bottom diffusion regions 106a and 102; and second vertical channel region 122 is formed between left and bottom diffusion regions 104 and 102. Thus, there is basically three channels found completely within a single cell. And, as will be explained more fully below, each horizontal and vertical channel is capable of storing two bits. In view of this twin-bit storage and the symmetrical design, where substantially identical cells are fabricated adjacent one another, an additional (second) horizontal channel can be formed between the bottom diffusion regions of two pairs of adjacent cells. In particular, as shown in FIG. 1b, left second horizontal channel portion 123a is formed between the bottom diffusion regions 102a and 102b of cell pair 100a and 100b, respectively. And right second horizontal channel portion 123b is formed between the bottom diffusion regions 102a and 102c of cell pair 100a and 100c.

Each cell 100 further includes thin (tunneling) oxide layer 110, nitride layer 111, and insulating oxide layer 112, which are uniformly layered over the exposed portions of semiconductor substrate 101, bottom diffusion channel 102, and second semiconductor layer 103 (including left and right diffusion regions) (as illustrated in FIG. 1a) to form a trapping dielectric layer. In one embodiment, oxide layer 110 and 112 are each approximately 100 micron thick whereas the nitride layer is approximately 50 microns thick. Although these dielectric structures have been illustrated as being formed by sandwiching a nitride layer between a thin tunneling oxide and insulating oxide, other dielectric structures could be used instead, such as $SiO_2/Al_2O_3/SiO_2$.

Access to each bit in cell 100 is controlled by the combination of wordline 115 and the diffusion regions 102, 104 and 106. Wordline 115 is formed of polysilicon directly on top of the ONO dielectric layer. As is known by those of ordinary skill in the art, diffusion regions 102, 104, 106 in a MOS transistor are indistinguishable in a zero-bias state; thus, the role of each diffusion region is defined after terminal voltages are applied with the drain biased higher than the source. Thus, by application of particular biasing voltages and a sufficient voltage on a particular wordline various bits can be programed, read or erased.

Figure 3A:
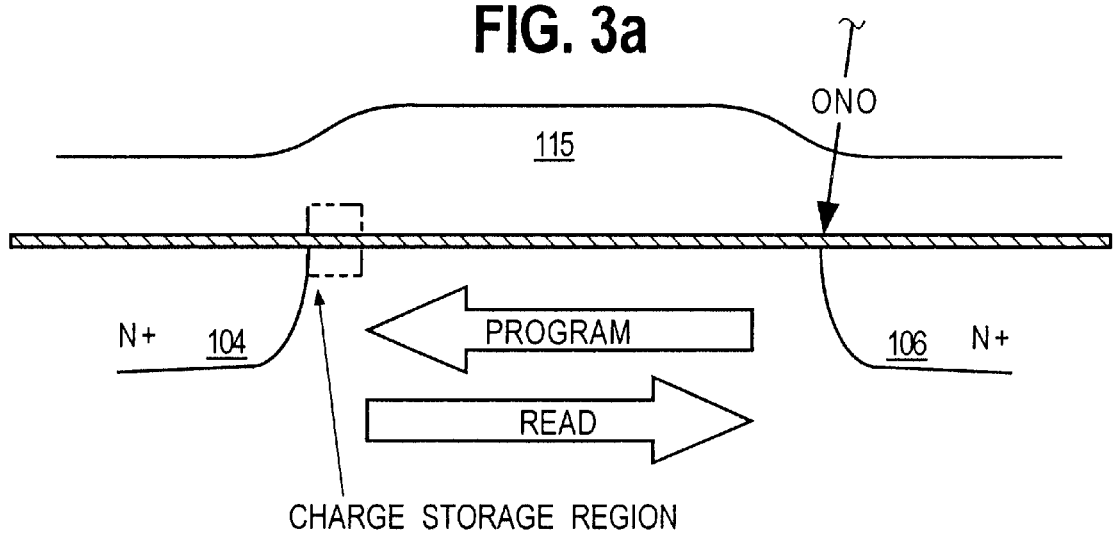
FIG. 3A is a partial cross-sectional view-taken along the wordline-illustrating the operation of the dielectric floating gate to store charge in the bit1 charge storage region.
Figure 3B:
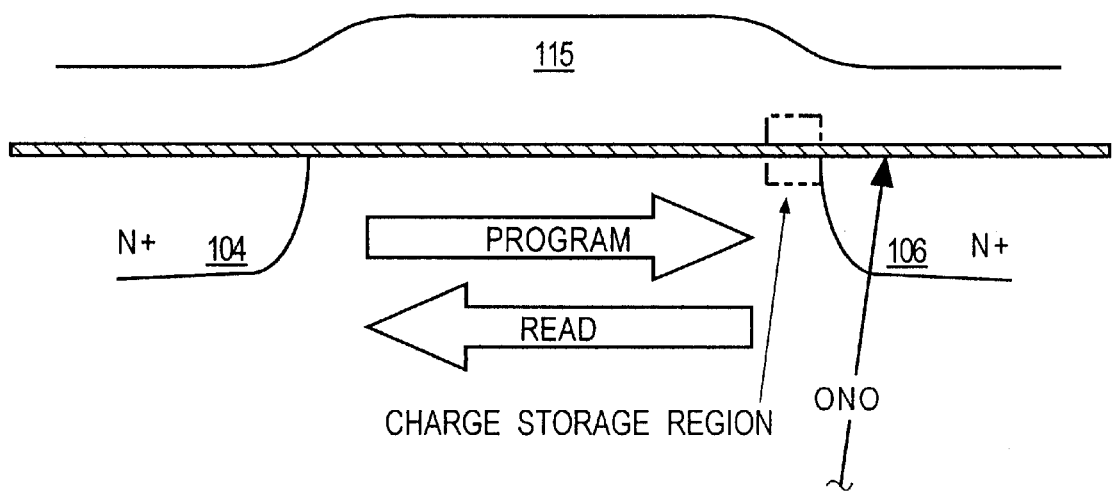
FIG. 3B is a partial cross-sectional view-taken along the wordline-illustrating the operation of the split floating gate to store charge in the bit2 charge storage region.

Bit storage in cell 100 is based, in part, on the discovery that by using a trapping dielectric layer one-bit of data can be stored and localized in a channel adjacent a each diffusion region. In addition, by reversing the program and read directions, interference between the each of the two charge storage regions can be avoided. The overall approach is shown for one particular pair (bit1/bit2) in FIGS. 3A and 3B. FIG. 3A illustrates the programming and reading of "bit1". To program the bit1, left diffusion region 104 is treated as the drain terminal (by applying a voltage of 4–6V), right diffusion region 106 is treated as the source (by applying 0V or low voltage for hot-e program), wordline 115 has applied 8–10V and the bottom diffusion regions all have voltages applied thereto to avoid program disturb of bits 3–8. To read bit1, the left diffusion region is treated as source (by applying a voltage of 0V) and the right diffusion is treated as the drain (by applying a voltage of 1–2V. As depicted by FIG. 3B, similar operations would be used to program and read bit2. This structure, which presents a thinner oxide layer to the programming currents allows for quicker programming with lower overall voltages.

Figure 4:
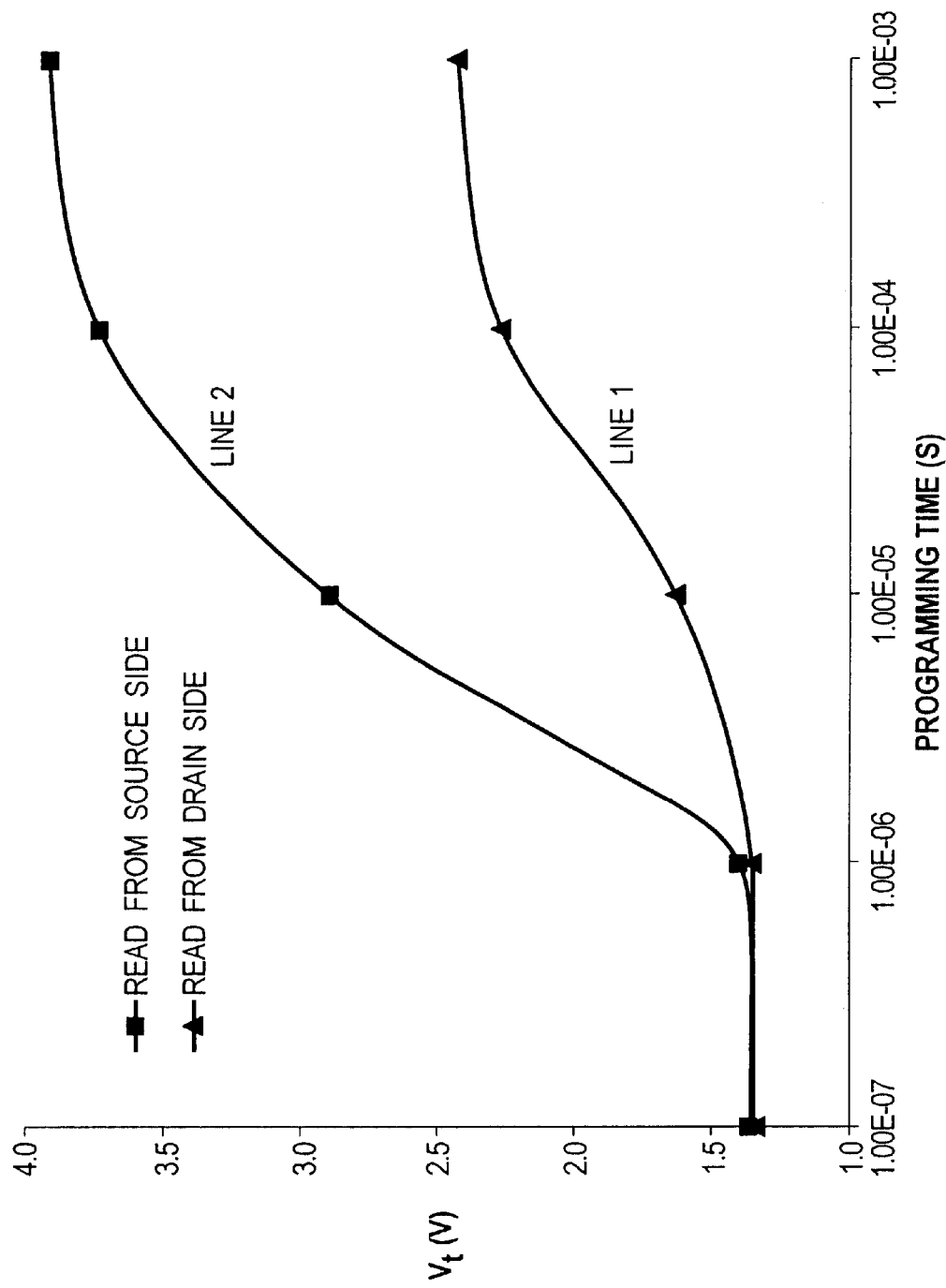
FIG. 4 is a graphical depiction of the effect of reversing the directionality of the program and read steps on the threshold voltages exhibited by each pair of bits in the eight-bit non-volatile cell structure of the present invention.

As shown in FIG. 4 (in which a charge was stored in bit2), the localized trapped electrons exhibit different threshold voltages if read in different directions. The first line depicts the threshold voltage when the right diffusion channel is used as drain (the same direction as in the program step). The second line depicts the threshold voltage when the left diffusion is used as drain (the reverse of the program step). As can be seen from these two lines, by reversing the read and program directions used, a more efficient threshold voltage behavior is exhibited. By utilizing this aspect of the design, even though both sides of a pair are programmed with information, only the threshold voltage of single bit is read by selecting either the left or right diffusion region to be the drain.

It should be noted with respect to bit5 and bit6, programming and reading of each of these bits require proper biasing of the bottom diffusion region of the adjacent cell. For instance, for programming bit5, bottom diffusion region 102a is treated as drain and bottom diffusion region 102c is treated as source. As for bit6, bottom diffusion region 102a is treated as drain and bottom diffusion region 102b is treated as source. Although not shown in the drawings, it should be understood that bit5 has a twin storage location associated with adjacent cell 100c and similarly bit6 has one associated with adjacent cell 100b. In sum, programming of the eight-bits of a single cell can be accomplished, assuming a selected wordline (8–10V), with the following biasing of various diffusion regions:

| Bit             | Bit1 | Bit2 | Bit3 | Bit4 | Bit5 | Bit6 | Bit7 | Bit8 |
|-----------------|------|------|------|------|------|------|------|------|
| Programmed      |      |      |      |      |      |      |      |      |
| Drain (4–6V)    | 104a | 106a | 106a | 102a | 102a | 102a | 102a | 104a |
| Source (0V)     | 106a | 104a | 102a | 106a | 102c | 102b | 104a | 102a |

(unspecified diffusion regions are biased to avoid program disturb).

Application of these biasing voltages and acquisition of data from each cell in a memory array can be visualized using, FIG. 2.

Erasure of these cells can be executed by one bit at a time or eight bits at a time. If high voltage is applied at bulk corresponding with zero or negative gate voltage, all eight bits will be erased together. If high voltage is applied at single diffusion terminal, only corresponding with zero or negative gate voltage, only single bit is erased. The over-erase phenomenon is avoided by the cell design because of the central channel region. Thus, even if the threshold voltages of storage regions bit1 and bit2 are over-erased, the effective threshold is still determined by central channel region. Consequently, the erased-threshold voltage of the structure is very tight and, thus, suitable for low power applications.

Preferred Method of Fabrication

There are various possible methods for fabricating the eight-bit cell of the present invention. In particular, one preferred process has been disclosed hereinbelow with the understanding that this process merely exemplifies the potential processes by which the eight-bit non-volatile memory structure of the present invention can be fabricated.

Figure 5C:
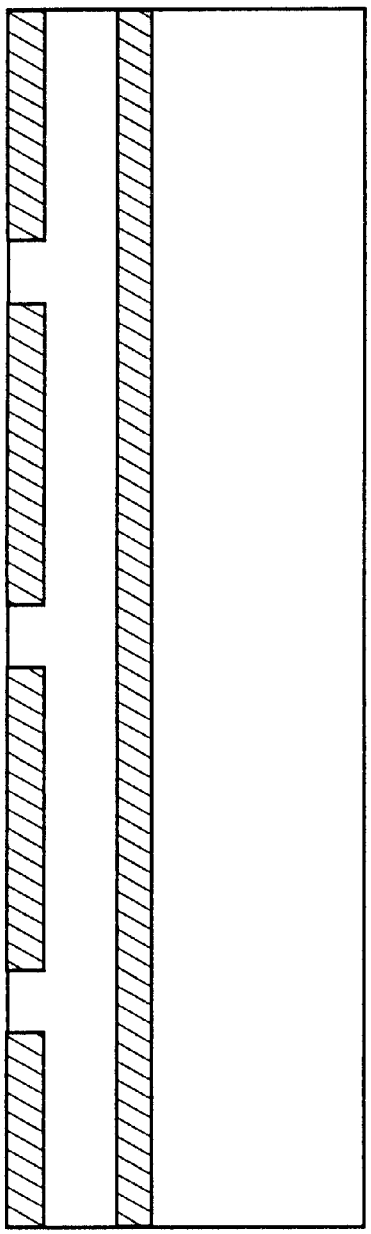
Figure 5D:
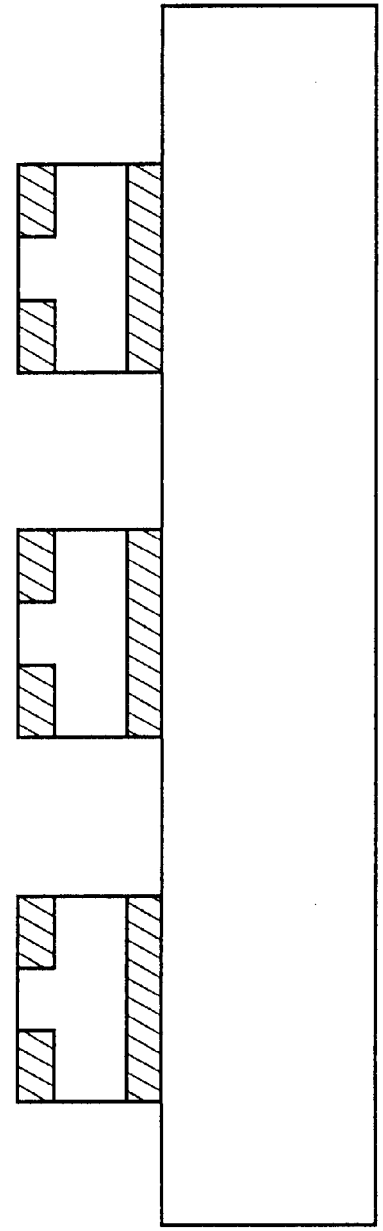
Figure 5E:
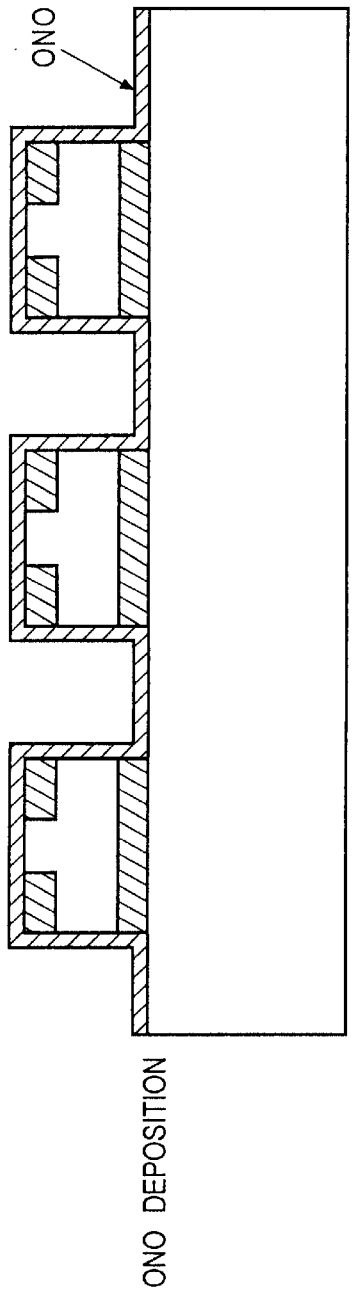
Figure 5F:
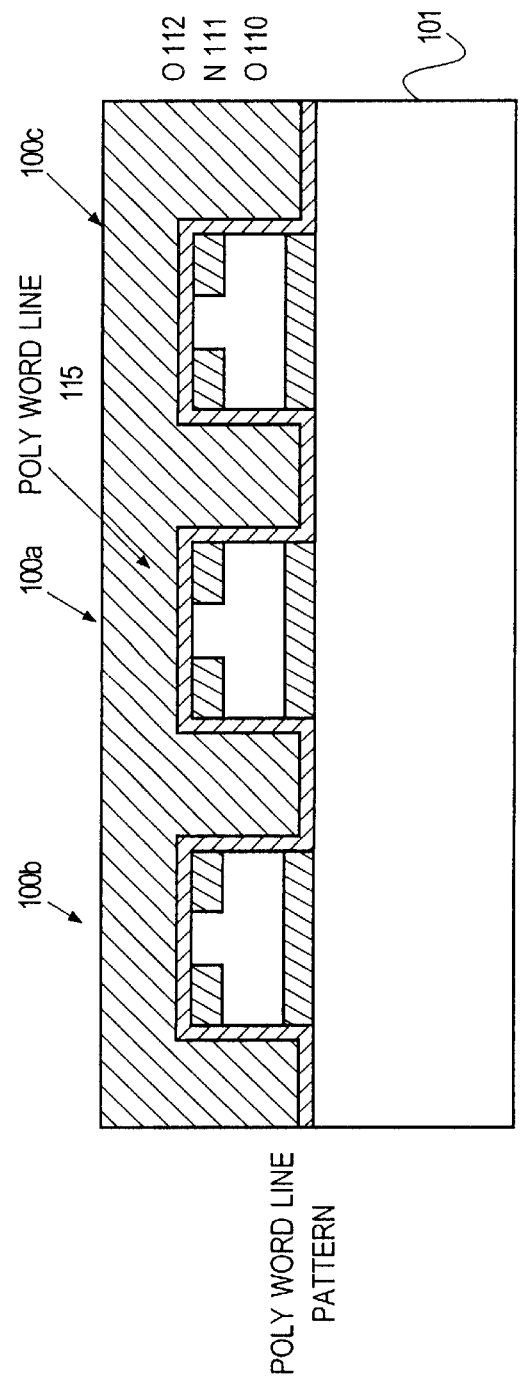

As shown in FIG. 5A, first a highly doping N+ is implanted to P-type silicon substrate 101. Then, as shown in FIG. 5B, a P-type silicon epitaxial layer is grown on the top of the N+ dopping layer. FIG. 5C shows the implantation of N+ in the epi-layer to form right and left diffusion channels. Thereafter, the resulting wafer is trenched by using bit line I mask (as shown in FIG. 5D). Next, bottom oxide, trapping dielectric and top oxide are deposited as shown in FIG. 5E. Finally, the polysilicon layer is deposited and a wordline mask is used to pattern the poly layer as shown in FIG. 5F.

In addition to the significant increase in storage, compared to conventional EEPROM or Flash EEPROM, the process of fabricating structure 100 is much simpler because there is no floating gate. Thus, the various difficulties of the prior art related to the floating gate, such as fabrication of the floating gate and insulation between the control and floating gate are avoided. In addition, the over-erase phenomenon is avoided because of the central channel region (which exhibits the dominant threshold voltage of the structure) and the inability of the left and right storage regions (which could be "over-erased") to control the entirety of the channel.

The gate coupling ratio ("GCR") of structure 100 is 100%. Consequently, both the program and erase voltages used in combination with this structure can be lower than the program and erase voltages of standard EEPROM or Flash EEPROM cells. As a result of these lower program and erase voltages, smaller pumping effort is required. In addition, these lower voltages release the circuit and process overhead.

A similar consequence of the greatly improved GCR is that the read current of structure 100 is much higher than that of standard EEPROM or Flash EEPROM cells. Thus, higher performance can be achieved with this inventive structure.

The foregoing description and drawings merely explain and illustrate the invention and the invention is not limited thereto. Those of the skill in the art who have the disclosure before them will be able to make modifications and variations therein without departing from the scope of the present invention.

What is claimed is:

1. A method of fabricating a non-volatile semiconductor memory device for storing up to eight-bits of information comprising:

forming a semiconductor substrate of one conductivity type;

implanting ions in the semiconductor substrate to form a bottom diffusion region of a conductive type opposite to the conductivity type of the semiconductor substrate;

growing a second semiconductor layer on at least a portion of said bottom diffusion region;

implanting ions in the second semiconductor layer to form in the second semiconductor layer right and left diffusion regions, said right diffusion region being spaced apart from said left diffusion region to form a first horizontal channel region and from said bottom diffusion region to form a first vertical channel region, said left diffusion region being spaced from said bottom diffusion region to form a second vertical channel region, each of the right and left diffusion regions being of the of the same conductivity type as the bottom diffusion;

trenching the second semiconductor layer outside the first horizontal channel region, the first vertical channel region and the second vertical channel region to form a middle free-standing cell on the semiconductor substrate;

depositing a trapping dielectric structure on exposed faces of the middle free-standing cell and semiconductor substrate; and depositing a polysilicon control gate on top of the trapping dielectric structure.

2. The method according to claim 1 further comprising forming a left free-standing cell substantially identical to the middle free-standing cell on the semiconductor substrate to the left of the middle free-standing cell, but the left free-standing cell bottom diffusion region being spaced apart from the middle free-standing cell bottom diffusion region to form a second horizontal channel region within the semiconductor substrate in the trench between the left and middle free-standing cells.

3. The method according to claim 2 further comprising forming a right free-standing cell substantially identical to the middle free-standing cell on the semiconductor substrate to the right of the middle free-standing cell, but the right free-standing cell bottom diffusion region being spaced apart from the middle free-standing cell bottom diffusion region to form a third horizontal channel region within the semiconductor substrate in the trench between the right and middle free-standing cells.

4. The method according to claim 3 further comprising making at least one of the first horizontal channel region, the second horizontal channel region, the third horizontal channel region, the first vertical channel region, the second vertical channel, region long enough such that two bits of information can be reliably stored within those long enough channel.

5. The method according to claim 3 further comprising making at least one of the first horizontal channel region, the first vertical channel region and the second vertical channel region long enough such that two bits of information can be reliably stored within those long enough channel.

6. The method according to claim 2 further comprising making at least one of the first horizontal channel region, the second horizontal channel region, the first vertical channel region and the second vertical channel region long enough such that two bits of information can be reliably stored within those long enough channel.

\* \* \* \* \*